United States Patent
Bhattacharyya

(10) Patent No.: US 10,809,317 B2
(45) Date of Patent: Oct. 20, 2020

(54) SPATIALLY DEPENDENT CORRECTION OF MAGNETIC FIELD SENSOR READINGS

(71) Applicant: Apple Inc., Cupertino, CA (US)

(72) Inventor: Manoj K. Bhattacharyya, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 475 days.

(21) Appl. No.: 15/692,278

(22) Filed: Aug. 31, 2017

(65) Prior Publication Data

US 2018/0088186 A1 Mar. 29, 2018

Related U.S. Application Data

(60) Provisional application No. 62/399,001, filed on Sep. 23, 2016.

(51) Int. Cl.
| | | |
|---|---|---|
| G01R 33/02 | (2006.01) | |
| G01R 33/00 | (2006.01) | |
| G01D 5/20 | (2006.01) | |
| G01B 7/008 | (2006.01) | |
| G01B 7/14 | (2006.01) | |
| G01B 7/30 | (2006.01) | |
| G01D 5/14 | (2006.01) | |

(52) U.S. Cl.
CPC ............. *G01R 33/02* (2013.01); *G01B 7/008* (2013.01); *G01B 7/14* (2013.01); *G01B 7/30* (2013.01); *G01D 5/145* (2013.01); *G01D 5/2013* (2013.01); *G01R 33/0017* (2013.01); *G01R 33/0023* (2013.01); *G01R 33/0082* (2013.01)

(58) Field of Classification Search
CPC ................ G01R 33/10; G01R 33/0082; G01R 33/0017; G01R 33/0023; G01R 33/0029; G01R 33/0035; G01R 33/02; G01R 33/0206; G01B 7/004; G01B 7/008; G01B 7/14; G01B 7/30; G06F 3/0354; G01D 5/145; G01D 5/2013; G01D 5/2449; G01D 5/24495; G01D 18/008; G01C 25/00; G01C 25/005
See application file for complete search history.

(56) References Cited

U.S. PATENT DOCUMENTS

| | | | | |
|---|---|---|---|---|
| 2006/0156564 | A1* | 7/2006 | Kwon | G01C 25/00 33/355 R |
| 2013/0158928 | A1* | 6/2013 | Hogdal | G01C 21/18 702/104 |
| 2014/0297212 | A1* | 10/2014 | Anderson | G01C 25/005 702/90 |
| 2015/0006099 | A1 | 1/2015 | Pham et al. | |

* cited by examiner

*Primary Examiner* — Son T Le
*Assistant Examiner* — Dustin R Dickinson
(74) *Attorney, Agent, or Firm* — Fish & Richardson P.C.

(57) ABSTRACT

In an embodiment, a method comprises: obtaining, by a sensing device on a ferromagnetic surface, a first magnetometer reading of magnetic flux density modified by the ferromagnetic surface in a first direction; obtaining, by the sensing device, a second magnetometer reading of magnetic flux density modified by the ferromagnetic surface in a second direction; obtaining, by the sensing device, sensitivity terms based on the first and second magnetometer readings; and storing, by the sensing device, the sensitivity terms and a location of the sensing device on the ferromagnetic surface.

10 Claims, 4 Drawing Sheets

SPATIALLY DEPENDENT CORRECTION OF MAGNETIC FIELD SENSOR READINGS

CROSS-REFERENCE TO RELATED APPLICATION

This application claims priority to U.S. Provisional Patent Application No. 62/399,001, filed Sep. 23, 2016, the entire contents of which are incorporated herein by reference.

TECHNICAL FIELD

This disclosure relates generally to compensating magnetic field sensor readings in electronic systems.

BACKGROUND

Magnetic interference affects an electronic system by electromagnetic induction, magnetostatic coupling or electrical current induced field. Magnetic interference can be problematic in, for example, electronic systems that are in close proximity to several magnetic interference sources. For example, magnetic interference can result in a compass heading error that impacts the performance of a navigation application running on the electronic system.

SUMMARY

In an embodiment, a method comprises: obtaining, by a sensing device on a ferromagnetic surface, a first magnetometer reading of magnetic flux density modified by the ferromagnetic surface in a first direction; obtaining, by the sensing device, a second magnetometer reading of magnetic flux density modified by the ferromagnetic surface in a second direction; obtaining, by the sensing device, sensitivity terms based on the first and second magnetometer readings; and storing, by the sensing device, the sensitivity terms and a location of the sensing device on the ferromagnetic surface.

In an embodiment, a method comprises: obtaining a location of a sensing device on a ferromagnetic surface; obtaining sensitivity terms associated with the location, where the sensitivity terms provide spatial dependent correction of magnetic fields modified by the ferromagnetic surface; obtaining readings from a magnetometer of the sensing device; and applying a spatial dependent correction of the magnetometer readings using the sensitivity terms.

In an embodiment, a method comprises: obtaining, by a sensing device on a ferromagnetic surface, a first magnetometer reading of magnetic flux density modified by the ferromagnetic surface in a first direction; obtaining, by the sensing device, a second magnetometer reading of magnetic flux density modified by the ferromagnetic surface in a second direction; obtaining, by the sensing device, sensitivity terms based on the first and second magnetometer readings; and storing, by the sensing device, the sensitivity terms and a location of the sensing device on the ferromagnetic surface.

Particular embodiments disclosed herein provide one or more of the following advantages. Position dependent distortion of an external magnetic field can be described by a sensitivity matrix. The sensitivity matrix can be used to compensate magnetometer readings while an electronic device housing the magnetometer is placed on a ferromagnetic surface, such as charging mat. The compensation of magnetometer readings allows a compass application running on the electronic device to provide accurate compass readings while subjected to the external magnetic field modified by the ferromagnetic charge mat.

The details of the disclosed embodiments are set forth in the accompanying drawings and the description below. Other features, objects and advantages are apparent from the description, drawings and claims.

DESCRIPTION OF DRAWINGS

The same reference symbol used in various drawings indicates like elements.

DETAILED DESCRIPTION

Example System

Figure 1:
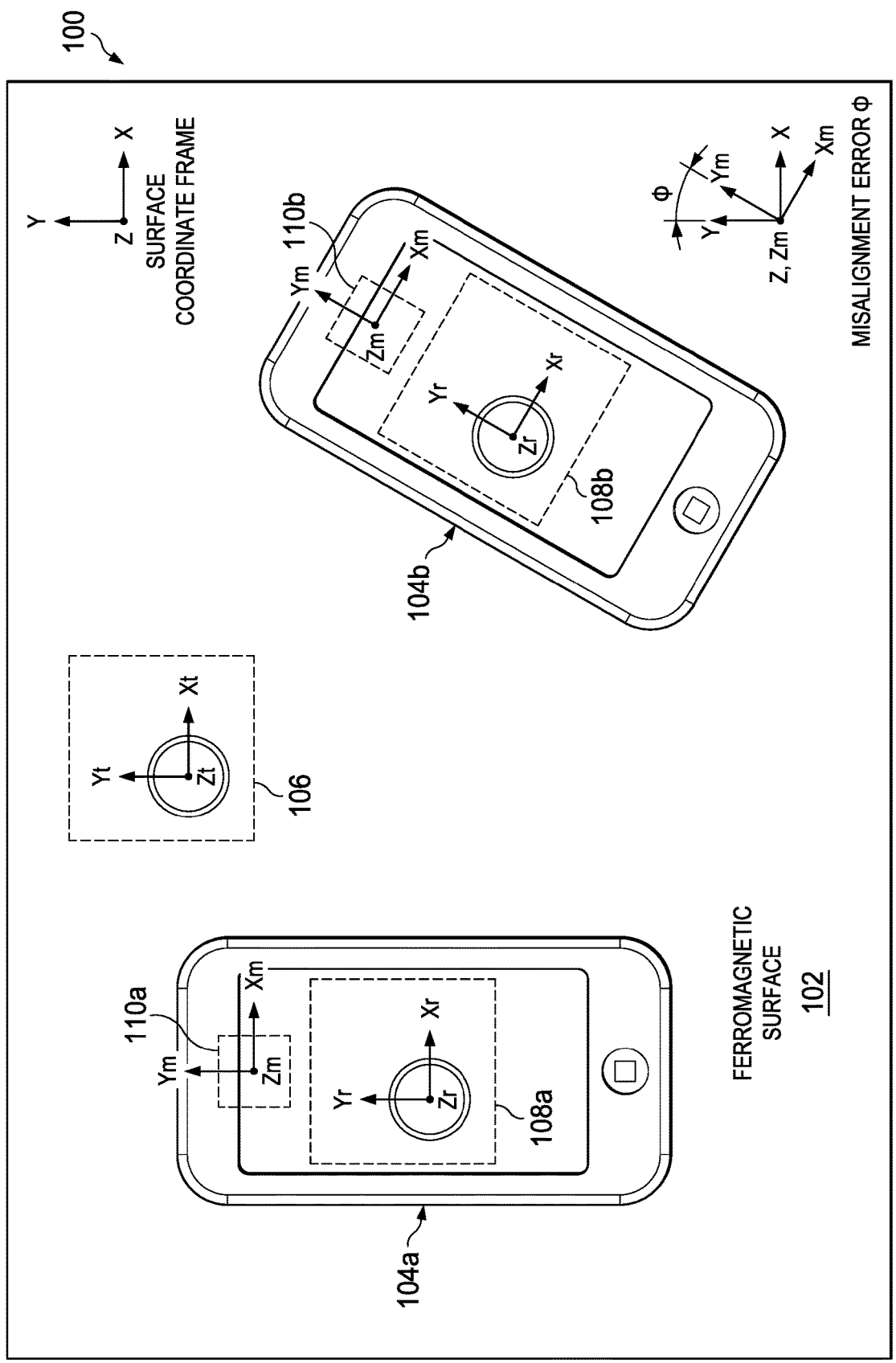
FIG. 1 illustrates a wireless power transfer system with spatially dependent correction of magnetic field sensor readings, according to an embodiment.

FIG. 1 illustrates a wireless power transfer system 100 with spatially dependent correction of magnetic field sensors, according to an embodiment. System 100 includes power transmission surface 102, mobile devices 104a, 104b and power transmitter unit 106. In an embodiment, power transfer system will have a plurality of power transmitter units 106 with known positions on power transmission surface 102. Transmission surface 102 is, generally, made of ferromagnetic material to improve power transmission efficiency. Mobile device 104a includes inductive power receiver 108a and magnetic field sensor 110a. Mobile device 104 includes inductive power receiver 108b and magnetic field sensor 110b.

System 100 can be, for example, compliant with the QI interface standard developed by the Wireless Power Consortium for inductive electrical power transfer. To use system 100, one or more mobile devices 104a, 104b are placed on top of power transmission surface 102 (e.g., a ferromagnetic surface), which charges mobile devices 104a, 104b using resonant inductive coupling. Mobile devices 104a, 104b can be any electronic device that could benefit from spatially dependent corrections of magnetic field sensor readings, including but not limited to: smartphones, tablet computers and wearable devices.

In an embodiment, power transmitter 106 includes a planar transmitter coil that generates an oscillating magnetic field. The magnetic field generated by power transmitter 106 induces an alternating current in the receiving coils of power receivers 108a, 108b by Faraday's law of induction. Close spacing and alignment between the transmitter coil and the receiver coil ensure efficient inductive power transfer.

The transmitter coil and receiver coil can be aligned using various approaches, including but not limited to guided positioning where a user places mobile devices 104a, 104b at a certain location on surface 102. Mobile devices 104a, 104b then provide an alignment aid that indicates when the transmitter coil and receiver coil are aligned for maximum inductive power transfer. The alignment aid can be one or more of visual, audio or haptic feedback (e.g., a vibration). In another use scenario, the user can freely position mobile devices 104a, 104b anywhere on surface 102. In some embodiments, free positioning is implemented using a bundle of transmitting coils to generate a magnetic field at the location of the receiving coil or mechanical means to move a single transmitting coil underneath the receiving coil. In other embodiments, multiple cooperative flux generators can be used to allow free positioning of mobile devices 104a, 104b on surface 102. Aligning the receiver coil will improve the efficiency but the power transmission will continue without proper alignment, albeit at a reduced transmission efficiency.

In FIG. 1, there are multiple coordinate frames shown that will be used to described the disclosed embodiments. A surface coordinate frame fixed to surface 102 is represented by unit basis vectors <X, Y, Z>, where +Z is directed out of surface 102 to be consistent with the "right hand rule." A receiver coil coordinate frame is represented by unit basis vectors <Xr, Yr, Zr>, where +Zr is directed out of surface 102. A transmitter coil coordinate frame is represented by unit basis vectors <Xt, Yt, Zt>, where +Zt is directed into surface 102. Mobile devices 104a, 104b include magnetic field sensors 110a, 110b, respectively, which are represented by unit basis vectors <Xm, Ym, Zm>, where +Zm is directed out of surface 102. In an embodiment, magnetic field sensors 110a, 110b are 3-axis magnetometers, which can be used with magnetic compass applications.

In the example shown, mobile device 104a is placed on surface 102 so that the sensor unit basis vectors <Xm, Ym, Zm> are aligned with surface unit basis vectors <X, Y, Z> and mobile device 104b is placed on surface 102 so that the sensor unit basis vectors <Xm, Ym, Zm> are offset from the surface unit basis vectors <X, Y, Z> by an angle Φ. The angle Φ is hereafter also referred to as the "misalignment error."

A 3-axis magnetometer measures Earth's magnetic field using three orthogonal magnetic field sensors. Measurements of the Earth's magnetic field can be quoted in units of nanotesla (nT). The three orthogonal sensors measure the components of Earth's magnetic field in three dimensions, for example, along the sensor unit basis vectors <Xm, Ym, Zm>. There are several factors internal to mobile devices 104a, 104b that can affect the operation of magnetometers 110a, 110b. These factors include but are not limited to: inherent magnetic offset change, distortion of Earth's magnetic field caused by magnetic material internal to the device ("soft-iron effect"), a magnetostatic field created by permanent magnets in mobile devices 104a, 104b, such as voice coils of cameras, speakers and receivers. Additionally, some haptic motors have magnets that can create magnetostatic fields.

Soft iron effects and magnetostatic fields can be corrected by on-demand or continuous calibration methods. However, some mobile devices 104a, 104b are expected to perform navigation while placed on surface 102. In such a use scenario, the distortion of Earth's magnetic field can be excessive due to the presence of ferromagnetic surface 102 and such distortion is dependent on the location of mobile devices 104a, 104b on surface 102. Even if mobile devices 104a, 104b are calibrated before placement on surface 102, navigation may not work once the mobile devices are placed on surface 102. Accordingly, a spatially dependent correction system and method are needed to correct for distortion of Earth's magnetic field.

Referring to FIG. 1, the position dependent distortion of Earth's magnetic field can be described by Equation [1]:

$$\begin{bmatrix} B_x^{read} \\ B_y^{read} \\ B_z^{read} \end{bmatrix} = \begin{bmatrix} S_{xx} & S_{xy} & S_{xz} \\ S_{yx} & S_{yy} & S_{yz} \\ S_{zx} & S_{zy} & S_{zz} \end{bmatrix} \begin{bmatrix} B_x^{applied} \\ B_y^{applied} \\ B_z^{applied} \end{bmatrix}, \quad [1]$$

where S is a sensitivity matrix, $\vec{B}^{read}$ is a magnetic field vector read from the 3-axis magnetometer and $\vec{B}^{applied}$ is a magnetic field applied to the 3-axis magnetometer. The diagonal terms of the sensitivity matrix S are principal sensitivities and the off-diagonal terms of the sensitivity matrix S are cross-axis sensitivities. The determination of the sensitivity matrix S in Equation [1] for mobile device 104a is straightforward. First mobile device 104a can be placed on surface 102 such that its sensor unit basis vectors <Xm, Ym, Zm> are aligned with the surface unit basis vectors <X, Y, Z> fixed to surface 102. A magnetic flux density of one unit magnitude is then applied in the X direction. The actual readings of magnetometer 110a in mobile device 104a constitutes the first column of the sensitivity matrix S or <Sxx, Syx, Szx>. Then a magnetic flux density of one unit magnitude is applied in the Y direction and the second column of the sensitivity matrix S is obtained or <Sxy, Syy, Szy>. Finally, a magnetic flux density of one unit magnitude is applied in the +Z direction and the third column of the sensitivity matrix S is obtained or <Sxz, Syz, Szz>. Once the sensitivity matrix S is determined at a known location on surface 102 the terms of the sensitivity matrix S can be stored, for example, in cache memory of mobile devices 104a, 104b, together with the location on surface 102. In an embodiment, magnetic localization or positioning techniques can be used to determine a location of mobile devices 104a, 104b on surface 102.

In general, one or more power transmitter units 106 on surface 102 and power receiving units 108a, 108b in mobile devices 104a, 104b will store position information by any variety of electronic means possible. In an embodiment, a radio frequency identification (RFID) tag can be used. Power receiving units 108a, 108b can receive RFID tag information from RFID tags embedded in surface 102. The RFID tags can include fixed or programmable logic for processing a received transmission from mobile devices 104a, 104b. Receiver units 108a, 108 transmit an encoded radio frequency signal to interrogate the RFID tags embedded in surface 102. The RFID tags receive the message and respond with identification and/or position information. In an embodiment, impulse radio ultrawide bandwidth (IR-UWB) RFID technology can be used with multilateration algorithms and time of arrival (TOA) estimation to provide accurate localization of mobile devices 104a, 104b on surface 102 with centimeter accuracy. Also, using the known positions of power transmitter units 106 and power receiving units 108a, 108b, multilateration and TOA estimation can be used to uniquely identify the location of mobile devices 104a, 104b on surface 102. Determination of the angular orientation of mobile devices 104a, 104b can be determined by accessing sensor information from sensors (e.g., gyros, accelerometers) in mobile devices 104a, 104b before contact with surface 102 is made.

Sensitivity matrices for multiple locations on surface 102 can be determined by numerical simulation or experimentally determined during manufacture by one representative surface 102. In some use scenarios, sensitivity matrices for each individual surface to be deployed in the marketplace can be determined experimentally. Experimental determination can be done, for example, in a zero-gauss chamber to avoid interference from unaccounted for magnetic fields.

The actual applied magnetic flux densities can be found by multiplying the readings of magnetometer 110a by the inverse of the sensitivity matrix S for the location of mobile device 104a on surface 102, as shown in Equation [2]:

$$\begin{bmatrix} F_x^{applied} \\ F_y^{applied} \\ F_z^{applied} \end{bmatrix} = \begin{bmatrix} S_{xx} & S_{xy} & S_{xz} \\ S_{yx} & S_{yy} & S_{yz} \\ S_{zx} & S_{zy} & S_{zz} \end{bmatrix}^{-1} \begin{bmatrix} F_x^{read} \\ F_y^{read} \\ F_z^{read} \end{bmatrix} \quad [2]$$

The vector $\vec{F}^{read}$ in Equation [2] represents the magnetic flux density (represented by $\vec{B}^{read}$ in Equation [1]). It is customary to use the variable "B" for magnetic flux density and that nomenclature will be used hereafter. The use of the variable "F" in Equation [2] is to distinguish Equation [1] from Equation [2]. When mobile device 104a is placed on surface 102, the location of mobile device 104a on surface 102 can be determined by its onboard sensors or other location determination means and the location on surface 102 can be used to select the stored sensitivity matrix S from cache memory for that location. Because the sensor unit basis vectors <Xm, Ym, Zm> of mobile device 104a are aligned with the surface unit basis vectors <X, Y, Z> Equation [2] can be used without further modification.

Referring now to mobile device 104b, because the sensor unit basis vectors <Xm, Ym, Zm> of mobile device 104b are misaligned with the surface unit basis vectors <X, Y, Z> by angle Φ, Equation [2] cannot be used without further modification because the sensor and surface reference frames were aligned when the sensitivity matrix S was determined (Φ=0). Because mobile device 104b is rotated on surface 102 the misalignment error Φ is no longer zero. For mobile device 104b, the misalignment error Φ can be removed using a coordinate transformation matrix A in Equation [2] as shown in Equation [3]

$$\vec{F}^{applied} = S^{-1} A \vec{F}^{read}, \quad [3]$$

where A is given by Equation [4]:

$$A = \begin{bmatrix} \cos\Phi & -\sin\Phi & 0 \\ \sin\Phi & \cos\Phi & 0 \\ 0 & 0 & 1 \end{bmatrix}. \quad [4]$$

Transformation matrix A in Equation [3] removes the misalignment error Φ prior to applying the sensitivity matrix S to the vector $\vec{F}^{read}$. In addition, each time mobile device 104b is rotated while in contact with surface 102, other motion determination sensors already present in mobile device 104b (e.g., accelerometers, gyros) can take measurements. In another embodiment, the user can lift mobile device 104b from surface 102 and refresh the angular position.

If surface 102 is moving, the misalignment error Φ in Equation [3] can be determined from sensors onboard mobile device 104b. First we assume that surface 102 is fixed to a moving body, such as a car, plane, boat, bus, train and the like. We further assume that mobile device 104b includes accelerometers that can sense linear acceleration or deceleration of mobile device 104b in a direction of movement of the moving body. This assumption is valid if acceleration due to gravity is excluded and the moving body is not turning (no angular acceleration component). Acceleration data and angular rate data (e.g., from a 3-axis rate gyro) can be collected over a period of time and used to determine if a peak acceleration or deceleration data correlates with peaks in angular sensor data to determine if the moving body is turning. When the moving body is not turning a principle acceleration vector in the X-Y plane can be determined and used to calculate the misalignment error Φ, as described in U.S. Patent Publication No. 2015/0006099A1, published on Jan. 1, 2015, for "Detecting Mount Angle of Mobile Device in Vehicle Using Motion Sensors," which U.S. Patent Publication is incorporated by reference herein in its entirety.

In another embodiment, the misalignment matrix A can be determined using a calibration procedure. The user can place their mobile device on surface 102a at a calibration orientation, such that the sensor unit basis vectors <Xm, Ym, Zm> align with the surface unit basis vectors <X, Y, Z>, as shown for mobile device 104a. The user can be guided to the correct orientation using guided positioning provided by the mobile device. Once the unit basis vectors area aligned, a snapshot of the body-to-earth fixed coordinate direction cosine matrix (DCM) or quaternion of the mobile device can be stored by the device. After performing the calibration, the user can place the mobile device in any orientation on surface 102. The misalignment angle Φ can be computed by comparing current body-to-earth fixed coordinate DCM or quaternion with the reference DCM or quaternion. If quaternions are used, this difference is commonly referred to as a "delta quaternion." This calibration method will work provided surface 102 does not move from its orientation after calibration. If the orientation surface 102 changes after calibration, the calibration method will need to be performed again by the user.

In another embodiment, one or more sensors can be embedded in surface 102, such as an accelerometer and/or gyro. The sensors would allow surface 102 to maintain a body-to-earth fixed DCM or quaternion, which can be shared with the mobile device over a short range communication link. In an embodiment, the short range communication link can be an inductive communication link using power transmitter 106. In another embodiment, a wireless transceiver chip can be embedded in surface 102 for establishing a Bluetooth link with the mobile device.

Figure 2:
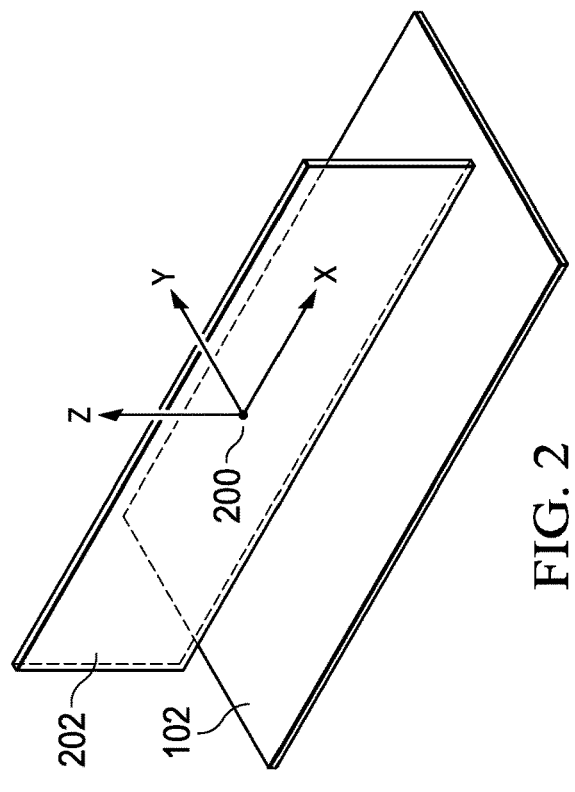
FIG. 2 illustrates application of a magnetic field to determine magnetic field distortion, according to an embodiment.

FIG. 2 illustrates application of a magnetic field to determine magnetic field distortion, according to an embodiment. A field of 1 Gauss (100 μT) is applied in the X direction. The separation of magnetometer 200 from surface 102 is also shown as ΔZ. Rectangular area 202 is considered for observing the magnetic field distortion shown in FIG. 3.

Figure 3:
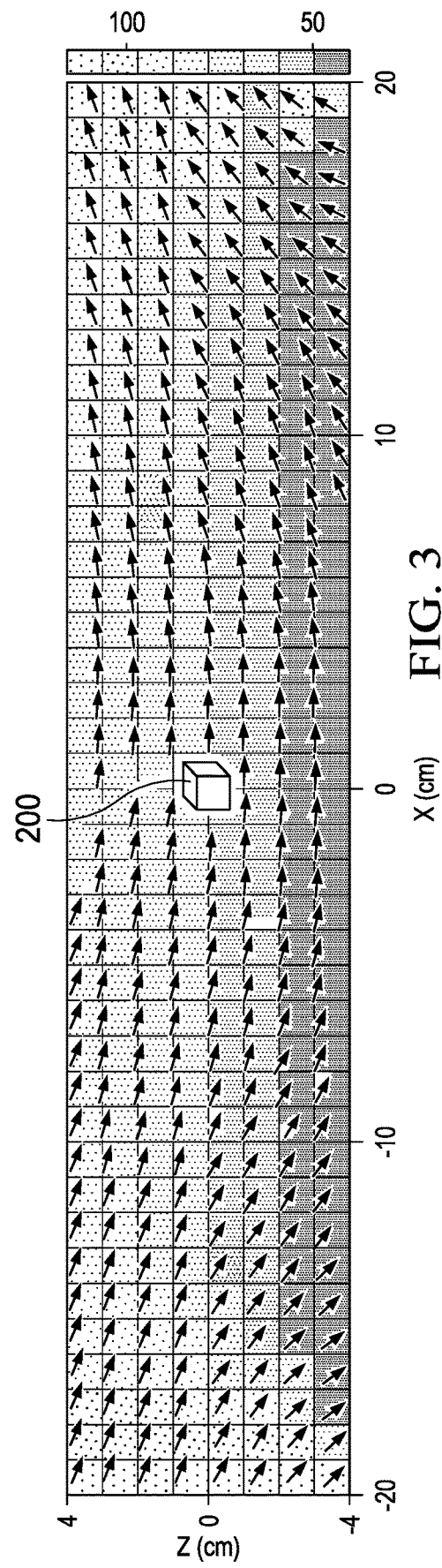
FIG. 3 illustrates magnetic field distortion, according to an embodiment.

FIG. 3 illustrates the magnetic field distortion due to the applied magnetic field, according to an embodiment. Distortion of the X field above ferromagnetic surface 102 is shown. The shaded surface map represents the X component of the magnetic field As shown in FIG. 3, even though 100 μT of external Bx is applied, the field near surface 102 is heavily distorted (as shown by the arrows and darker shades). At the (0,0) location of sensor 200, the X magnitude is substantially reduced. Most of the externally applied magnetic flux goes through the more permeable ferromagnetic surface 102. Because of this magnetic distortion, the compass reading will be substantially different than the applied magnetic field.

Example Processes

Figure 4:
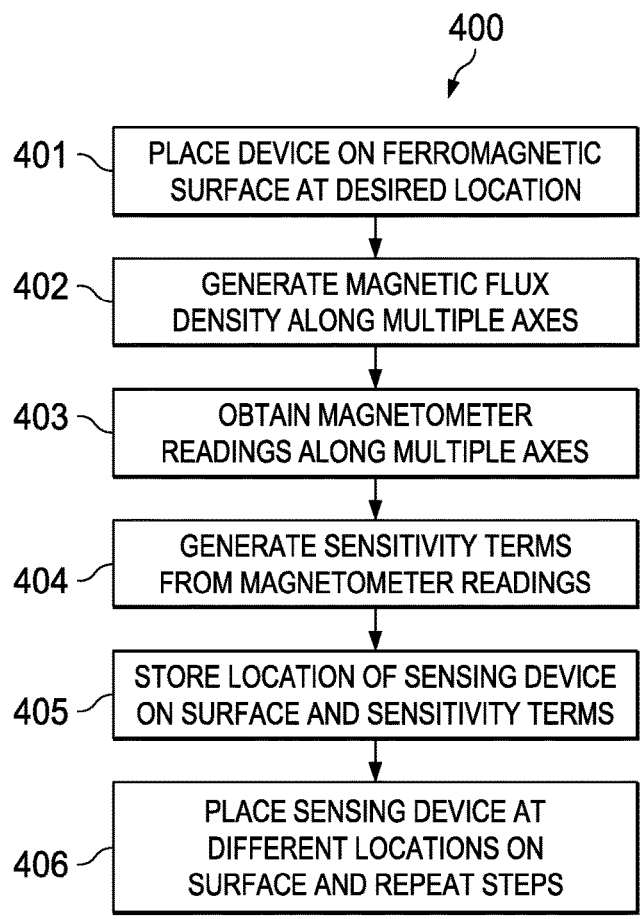
FIG. 4 is a flow diagram of an example process of generating a sensitivity matrix for spatially dependent correction of magnetic field sensor readings, according to an embodiment.

FIG. 4 is a flow diagram of an example process 400 of generating a sensitivity matrix for spatially dependent correction of magnetic field sensor readings, according to an embodiment. Process 400 can be implemented by device architecture 600, as described with reference to FIG. 6.

Process 400 can begin by placing a sensing device on a ferromagnetic surface at a desired location (401) and generating, in sequence, one unit magnitude magnetic flux density along axes of a surface coordinate frame (402). For each axis, a magnetometer reading is obtained (403). In some implementations, the magnetometer is 3-axis magnetometer and the magnetic flux density is generated along three axes in the surface coordinate frame. The sensing device can be orientated on the surface such that the sensing axes of the magnetometer are aligned with the unit basis vectors of the surface coordinate frame.

Sensitivity terms are then generated from the 3-axis magnetometer readings (404). For example, a magnetic flux density of one unit magnitude is applied in the X direction and a first reading of a 3-axis magnetometer is obtained. The first reading constitutes a first column of a sensitivity matrix. Then a magnetic flux density of one unit magnitude is applied in the Y direction and a second magnetometer reading is obtained, which constitutes a second column of the sensitivity matrix. Finally, a magnetic flux density of unit magnitude is applied in the +Z direction and a third reading of the magnetometer is obtained, which constitutes a third column of the sensitivity matrix.

Process 400 can continue by storing the location of the sensing device on the surface and the corresponding sensitivity terms generated for the location (405). Process 400 continues by placing the sensing device at a different location on the surface and repeating (406) the steps 401-405 or process 400. In embodiment, the location can be a region on the surface rather than a discrete location on the surface and one sensitivity matrix would be stored for each region.

Figure 5:
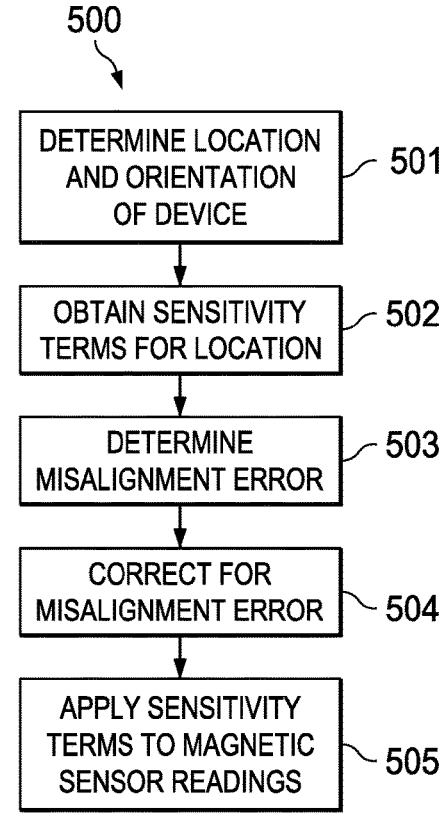
FIG. 5 is a flow diagram of an example process of spatially dependent correction of magnetic field sensor readings, according to an embodiment.

FIG. 5 is a flow diagram of an example process 500 of spatially dependent correction of magnetic field sensor readings, according to an embodiment. Process 500 can be implemented by device architecture 600, as described with reference to FIG. 6.

Process 500 can begin by determining the location and orientation of the sensing device (501), obtaining the sensitivity terms for the location (502), determining the misalignment error (503), correcting for the misalignment error (504) and applying the sensitivity terms to the magnetic sensor readings at the location (505). In an embodiment, the misalignment error can be determined using sensors onboard the sensing device. In some embodiments, the surface can include one or more sensors and wireless transceiver chip that can be used to determine the misalignment error.

Example Device Architecture

Figure 6:
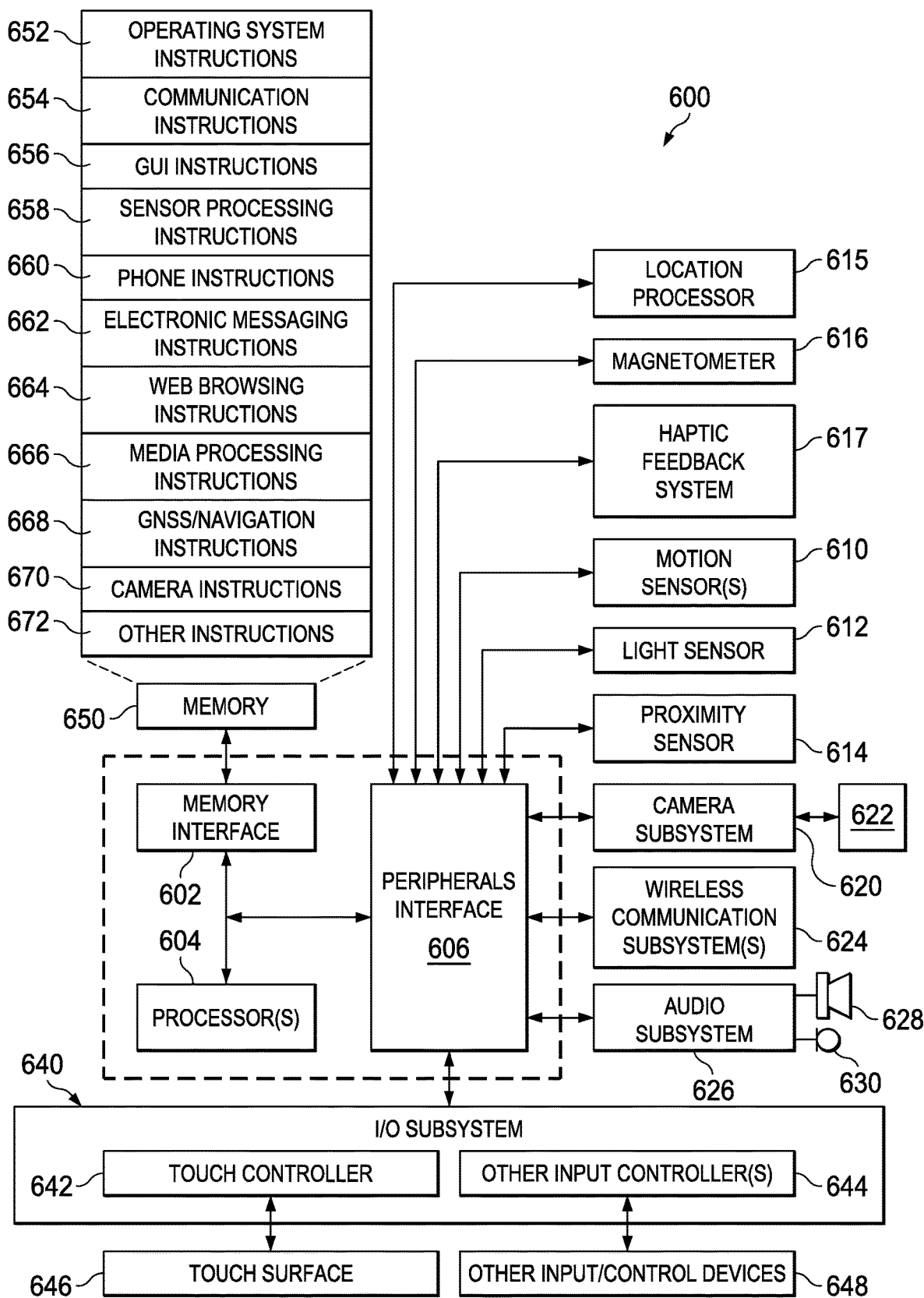
FIG. 6 is a block diagram of an example electronic system architecture, according to an embodiment.

FIG. 6 is a block diagram of an electronic system architecture 600. Architecture 600 may include memory interface 602, data processor(s), image processor(s) or central processing unit(s) 604, and peripherals interface 606. Memory interface 602, processor(s) 604 or peripherals interface 606 may be separate components or may be integrated in one or more integrated circuits. One or more communication buses or signal lines may couple the various components.

Sensors, devices, and subsystems may be coupled to peripherals interface 606 to facilitate multiple functionalities. For example, motion sensor(s) 610, light sensor 612, and proximity sensor 614 may be coupled to peripherals interface 606 to facilitate orientation, lighting, and proximity functions of the device. For example, in some embodiments, light sensor 612 may be utilized to facilitate adjusting the brightness of touch surface 646. In some embodiments, motion sensor(s) 610 (e.g., an accelerometer, rate gyroscope) may be utilized to detect movement and orientation of the device. Accordingly, display objects or media may be presented according to a detected orientation (e.g., portrait or landscape). Haptic feedback system 617, under the control of haptic feedback instructions 672, provides haptic feedback in the form of vibration.

Other sensors may also be connected to peripherals interface 606, such as a temperature sensor, a barometer, a biometric sensor, or other sensing device, to facilitate related functionalities. For example, a biometric sensor can detect fingerprints and monitor heart rate and other fitness parameters.

Location processor 615 (e.g., GNSS receiver chip) may be connected to peripherals interface 606 to provide georeferencing. Electronic magnetometer 616 (e.g., an integrated circuit chip) may also be connected to peripherals interface 606 to provide data that may be used to determine the direction of magnetic North. Thus, electronic magnetometer 616 may be used as an electronic compass. Electronic magnetometer can be a multi-axis magnetometer that includes a compensation coil as described in reference to FIGS. 1-8.

Camera subsystem 620 and an optical sensor 622, e.g., a charged coupled device (CCD) or a complementary metal-oxide semiconductor (CMOS) optical sensor, may be utilized to facilitate camera functions, such as recording photographs and video clips.

Communication functions may be facilitated through one or more communication subsystems 624. Communication subsystem(s) 624 may include one or more wireless communication subsystems. Wireless communication subsystems 624 may include radio frequency receivers and transmitters and/or optical (e.g., infrared) receivers and transmitters. Wired communication systems may include a port device, e.g., a Universal Serial Bus (USB) port or some other wired port connection that may be used to establish a wired connection to other computing devices, such as other communication devices, network access devices, a personal computer, a printer, a display screen, or other processing devices capable of receiving or transmitting data.

The specific design and embodiment of the communication subsystem 624 may depend on the communication network(s) or medium(s) over which the device is intended to operate. For example, a device may include wireless communication subsystems designed to operate over a global system for mobile communications (GSM) network, a GPRS network, an enhanced data GSM environment (EDGE) network, IEEE802.xx communication networks (e.g., Wi-Fi, Wi-Max, ZigBee™), 3G, 4G, 4G LTE, code division multiple access (CDMA) networks, near field communication (NFC), Wi-Fi Direct and a Bluetooth™ network. Wireless communication subsystems 624 may include hosting protocols such that the device may be configured as a base station for other wireless devices. As another example, the communication subsystems may allow the device to synchronize with a host device using one or more protocols or communication technologies, such as, for example, TCP/IP protocol, HTTP protocol, UDP protocol, ICMP protocol, POP protocol, FTP protocol, IMAP protocol, DCOM protocol, DDE protocol, SOAP protocol, HTTP Live Streaming, MPEG Dash and any other known communication protocol or technology.

Audio subsystem 626 may be coupled to a speaker 628 and one or more microphones 630 to facilitate voice-enabled functions, such as voice recognition, voice replication, digital recording, and telephony functions.

I/O subsystem 640 may include touch controller 642 and/or other input controller(s) 644. Touch controller 642 may be coupled to a touch surface 646. Touch surface 646 and touch controller 642 may, for example, detect contact and movement or break thereof using any of a number of touch sensitivity technologies, including but not limited to, capacitive, resistive, infrared, and surface acoustic wave technologies, as well as other proximity sensor arrays or other elements for determining one or more points of contact with touch surface 646. In one embodiment, touch surface 646 may display virtual or soft buttons and a virtual keyboard, which may be used as an input/output device by the user.

Other input controller(s) 644 may be coupled to other input/control devices 648, such as one or more buttons, rocker switches, thumb-wheel, infrared port, USB port, and/or a pointer device such as a stylus. The one or more buttons (not shown) may include an up/down button for volume control of speaker 628 and/or microphone 630.

In some embodiments, device 600 may present recorded audio and/or video files, such as MP3, AAC, and MPEG video files. In some embodiments, device 600 may include the functionality of an MP3 player and may include a pin connector for tethering to other devices. Other input/output and control devices may be used.

Memory interface 602 may be coupled to memory 650. Memory 650 may include high-speed random access memory or non-volatile memory, such as one or more magnetic disk storage devices, one or more optical storage devices, or flash memory (e.g., NAND, NOR). Memory 650 may store operating system 652, such as Darwin, RTXC, LINUX, UNIX, OS X, iOS, WINDOWS, or an embedded operating system such as VxWorks. Operating system 652 may include instructions for handling basic system services and for performing hardware dependent tasks. In some embodiments, operating system 652 may include a kernel (e.g., UNIX kernel).

Memory 650 may also store communication instructions 654 to facilitate communicating with one or more additional devices, one or more computers or servers, including peer-to-peer communications. Communication instructions 654 may also be used to select an operational mode or communication medium for use by the device, based on a geographic location (obtained by the GPS/Navigation instructions 668) of the device.

Memory 650 may include graphical user interface instructions 656 to facilitate graphic user interface processing, including a touch model for interpreting touch inputs and gestures; sensor processing instructions 658 to facilitate sensor-related processing and functions; phone instructions 660 to facilitate phone-related processes and functions; electronic messaging instructions 662 to facilitate electronic-messaging related processes and functions; web browsing instructions 664 to facilitate web browsing-related processes and functions; media processing instructions 666 to facilitate media processing-related processes and functions; GNSS/Navigation instructions 668 to facilitate GNSS (e.g., GPS, GLOSSNAS) and navigation-related processes and functions; camera instructions 670 to facilitate camera-related processes and functions; and other instructions 672 for implementing some or all the features and processes described in reference to FIGS. 1-5.

Each of the above identified instructions and applications may correspond to a set of instructions for performing one or more functions described above. These instructions need not be implemented as separate software programs, procedures, or modules. Memory 650 may include additional instructions or fewer instructions. Furthermore, various functions of the device may be implemented in hardware and/or in software, including in one or more signal processing and/or application specific integrated circuits (ASICs).

A number of embodiments have been described. Nevertheless, it will be understood that various modifications may be made. Elements of one or more embodiments may be combined, deleted, modified, or supplemented to form further embodiments. In yet another example, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

What is claimed is:

1. A method comprising:
obtaining a location of a sensing device on a ferromagnetic surface;
obtaining sensitivity terms associated with the location, where the sensitivity terms provide spatial dependent correction of magnetic fields modified by the ferromagnetic surface;
obtaining readings from a magnetometer of the sensing device; and
applying a spatial dependent correction of the magnetometer readings using the sensitivity terms.

2. The method of claim 1, further comprising:
determining a misalignment error between a magnetometer coordinate frame and a surface reference coordinate frame; and
applying a misalignment correction to the magnetometer readings prior to applying the spatial dependent correction.

3. The method of claim 2, wherein the misalignment error is determined using one or more sensors of the sensing device.

4. The method of claim 2, wherein determining the misalignment error further comprises:
determining a direction cosine matrix or quaternion representing an orientation of the sensing device with respect to an earth fixed reference frame; and
determining the misalignment error from a difference between the direction cosine matrix or quaternion and a reference direction cosine matrix or reference quaternion previously calculated and stored on the sensing device.

5. The method of claim 2, wherein determining the misalignment error further comprises:
determining, using one or more sensors of the sensing device, that the sensing device is accelerating and not turning;
determining, using the one or more sensors, a principal component of acceleration of the sensing device; and
determining the misalignment error using the principal component of acceleration.

6. A system comprising:
one or more processors;
memory coupled to the one or more processors and operable to store instructions, which, when executed by the one or more processors, cause the one or more processors to perform operations comprising:
- obtaining a location of a sensing device on a ferromagnetic surface;
- obtaining sensitivity terms associated with the location, where the sensitivity terms provide spatial dependent correction of magnetic fields modified by the ferromagnetic surface;
- obtaining readings from a magnetometer of the sensing device; and
- applying a spatial dependent correction of the magnetometer readings using the sensitivity terms.

7. The system of claim 6, further comprising:
determining a misalignment error between a magnetometer coordinate frame and a surface reference coordinate frame; and
applying a misalignment correction to the magnetometer readings prior to applying the spatial dependent correction.

8. The system of claim 7, wherein the misalignment error is determined using one or more sensors of the sensing device.

9. The system of claim 8, wherein determining the misalignment error further comprises:
- determining a direction cosine matrix or quaternion representing an orientation of the sensing device with respect to an earth fixed reference frame; and
- determining the misalignment error from a difference between the direction cosine matrix or quaternion and a reference direction cosine matrix or reference quaternion previously calculated and stored on the sensing device.

10. The system of claim 8, wherein determining the misalignment error further comprises:
- determining, using one or more sensors of the sensing device, that the sensing device is accelerating and not turning;
- determining, using the one or more sensors, a principal component of acceleration of the sensing device; and
- determining the misalignment error using the principal component of acceleration.

* * * * *